United States Patent
Meir et al.

(10) Patent No.: US 9,672,919 B2
(45) Date of Patent: Jun. 6, 2017

(54) TECHNIQUES FOR REDUCING POWER-DOWN TIME IN NON-VOLATILE MEMORY DEVICES

(71) Applicant: Apple Inc., Cupertino, CA (US)

(72) Inventors: Avraham Poza Meir, Rishon Le-Zion (IL); Eyal Gurgi, Petah-Tikva (IL); Shai Ojalvo, Moshav Olesh (IL)

(73) Assignee: Apple Inc., Cupertino, CA (US)

( * ) Notice: Subject to any disclaimer, the term of this patent is extended or adjusted under 35 U.S.C. 154(b) by 701 days.

(21) Appl. No.: 13/867,363

(22) Filed: Apr. 22, 2013

(65) Prior Publication Data
US 2014/0317365 A1 Oct. 23, 2014

(51) Int. Cl.
| | |
|---|---|
| *G11C 11/56* | (2006.01) |
| *G11C 16/10* | (2006.01) |
| *G11C 16/34* | (2006.01) |
| *G11C 27/00* | (2006.01) |
| *G06F 1/30* | (2006.01) |
| *G11C 5/14* | (2006.01) |
| *G11C 16/22* | (2006.01) |
| *G11C 16/30* | (2006.01) |

(52) U.S. Cl.
CPC .......... *G11C 16/10* (2013.01); *G11C 11/5628* (2013.01); *G11C 16/225* (2013.01); *G11C 27/005* (2013.01); *G06F 1/30* (2013.01); *G11C 5/148* (2013.01); *G11C 11/56* (2013.01); *G11C 11/5621* (2013.01); *G11C 16/22* (2013.01); *G11C 16/30* (2013.01); *G11C 16/34* (2013.01); *G11C 2211/5641* (2013.01)

(58) Field of Classification Search
CPC ..... G11C 11/56; G11C 2211/56; G11C 16/10; G11C 16/22; G11C 16/34; G06F 1/30; G06F 11/1072
See application file for complete search history.

(56) References Cited

U.S. PATENT DOCUMENTS

| | | | |
|---|---|---|---|
| 7,924,613 B1* | 4/2011 | Sommer | G11C 11/5628 365/185.03 |
| 2008/0084739 A1* | 4/2008 | Chae | G11C 16/3404 365/185.03 |
| 2008/0266948 A1* | 10/2008 | Jang | G11C 11/5628 365/185.03 |
| 2009/0043951 A1* | 2/2009 | Shalvi | G11C 11/56 711/103 |
| 2010/0217920 A1* | 8/2010 | Song | G06F 12/0246 711/103 |

(Continued)

*Primary Examiner* — Edward Dudek, Jr.
*Assistant Examiner* — Andrew Russell
(74) *Attorney, Agent, or Firm* — Meyertons, Hood, Kivlin, Kowert & Goetzel, P.C.

(57) ABSTRACT

A method includes, in a memory including analog memory cells, storing first data in a group of the memory cells using a first type of storage command that writes respective analog values to the memory cells in the group. Second data is stored in the memory cells in the group, in addition to the first data, using a second type of storage command that modifies the respective analog values of the memory cells in the group. Upon detecting imminent interruption of electrical power to the memory during storage of the second data, a switch is made to perform an alternative storage operation that is faster than the second type of storage command and protects at least the first data from the interruption.

20 Claims, 3 Drawing Sheets

(56) References Cited

U.S. PATENT DOCUMENTS

| | | | |
|---|---|---|---|
| 2010/0246260 A1* | 9/2010 | Kang | G11C 11/5621 |
| | | | 365/185.03 |
| 2011/0058440 A1* | 3/2011 | Smith | G11O 5/141 |
| | | | 365/229 |
| 2012/0005558 A1 | 1/2012 | Steiner et al. | |
| 2012/0069673 A1* | 3/2012 | Backhausen | G11C 16/10 |
| | | | 365/185.19 |

* cited by examiner

TECHNIQUES FOR REDUCING POWER-DOWN TIME IN NON-VOLATILE MEMORY DEVICES

FIELD OF THE INVENTION

The present invention relates generally to data storage, and particularly to methods and systems for reducing power-down time in non-volatile memory devices.

BACKGROUND OF THE INVENTION

Non-volatile memory devices that comprise analog memory cells, such as Flash devices, are typically required to withstand electrical power supply interruptions. Various techniques are known in the art for protecting data stored in memory devices against power interruptions.

For example, U.S. Patent Application Publication 2007/0143531, whose disclosure is incorporated herein by reference, describes a method for power loss recovery for bit alterable memory. A bit alterable memory device includes status bits for a colony of memory cells. The state of each status bit may be changed depending on the programming state of the non-volatile bit alterable memory. The status bits are examined to determine the write status of two separate colonies of memory cells in the event of a power loss. The information gathered from the status bits is used by a power loss recovery mechanism to determine whether the data written to a plurality of memory cell colonies is partially written.

U.S. Pat. No. 6,988,175, whose disclosure is incorporated herein by reference, describes a method for managing page-based data storage media such as Flash media. New data are written to the storage medium in a manner that precludes corruption of old data if the writing of the new data is interrupted. Specifically, risk zones are defined by identifying, for each page, the other pages whose data are put at risk of corruption if writing to the page is interrupted. A page, which otherwise would be the target of a write operation, is not written if any of the pages in its risk zone contain data that could be corrupted if the write operation is interrupted.

U.S. Pat. No. 7,420,847, whose disclosure is incorporated herein by reference, describes a non-volatile memory device that is able to recover data in the event of a program failure without having to maintain a copy of the data until the write is completed. In some embodiments, the data is recovered by logically combining the verify data for the (failed) write process maintained in data latches with the results of one or more read operations to reconstitute the data.

U.S. Pat. No. 7,924,613, whose disclosure is incorporated herein by reference, describes a method for data storage includes storing first data in analog memory cells using a first programming operation, which writes to the memory cells respective analog values representing respective bit values of the first data. Second data is stored in the analog memory cells in addition to the first data using a second programming operation, which modifies the respective analog values of the memory cells so as to represent bit value combinations of the first and second data. The first and second programming operations are defined such that, at all times during the second programming operation, the analog value of each memory cell remains unambiguously indicative of the respective bit value of the first data stored in that memory cell.

U.S. 2012/0005558, whose disclosure is incorporated herein by reference, describes a system and method for data recovery in a multi-level cell memory device. One or more bits may be programmed sequentially in one or more respective levels of multi-level cells in the memory device. An interruption of programming a subsequent bit in a subsequent second or greater level of the multi-level cells may be detected. Data may be recovered from the multi-level cells defining the one or more bits programmed preceding the programming interruption of the second or greater level.

U.S. 2010/0217920, whose disclosure is incorporated herein by reference, describes a memory system that includes a Flash memory and a memory controller. The Flash memory has at least two addresses with different program times. The memory controller is configured to assign an address corresponding to a shorter program time from among the at least two addresses for a write operation executed at interruption of a power supply to the Flash memory. The assigned address is used to store data of the memory controller in the Flash memory.

SUMMARY OF THE INVENTION

An embodiment that is described herein provides a method including, in a memory including analog memory cells, storing first data in a group of the memory cells using a first type of storage command that writes respective analog values to the memory cells in the group. Second data is stored in the memory cells in the group, in addition to the first data, using a second type of storage command that modifies the respective analog values of the memory cells in the group. Upon detecting imminent interruption of electrical power to the memory during storage of the second data, a switch is made to perform an alternative storage operation that is faster than the second type of storage command and protects at least the first data from the interruption.

In some embodiments, storing the second data includes backing-up the first data in an alternative storage location different from the group of the memory cells, and switching to perform the alternative storage operation includes copying at least the backed-up first data to an alternative group of the memory cells in the memory. Copying at least the backed-up first data may include storing the first data in the alternative group of the memory cells using the first type of storage command.

In an embodiment, storing the second data includes causing the analog values in the memory cells in the group to reach a given set of programming levels, and switching to perform the alternative storage operation includes causing the analog values in the memory cells in the group to reach an alternative set of programming levels, different from the given set. The alternative set may have fewer programming levels than the given set.

In an example embodiment, the alternative set of programming levels represents the first data without ambiguity, in spite of the interruption. In a disclosed embodiment, causing the analog values to reach the given set includes applying to the memory cells programming pulses that increase in energy by a given increment, and causing the analog values to reach the alternative set includes applying to the memory cells alternative programming pulses that increase in energy by an alternative increment, larger than the given increment.

In another embodiment, switching to perform the alternative storage operation includes suspending the storage of the second data, backing-up a state of the storage that was suspended, and, after the interruption ends, recovering the backed-up state and resuming the storage of the second data using the recovered state. Backing-up the state may include backing-up a current content of one or more page buffers of the memory. Additionally or alternatively, backing-up the state may include storing the state in an alternative group of the memory cells using the first type of storage command. In an embodiment, the method includes, upon detecting the imminent interruption, assessing a progress of the storage of the second data and deciding whether to switch to perform an alternative storage operation depending on the assessed progress.

There is additionally provided, in accordance with an embodiment of the present invention, apparatus including a memory and storage circuitry. The memory includes multiple analog memory cells. The storage circuitry is configured to store first data in a group of the memory cells using a first type of storage command that writes respective analog values to the memory cells in the group, to store in the memory cells in the group second data, in addition to the first data, using a second type of storage command that modifies the respective analog values of the memory cells in the group, and, upon detecting imminent interruption of electrical power to the memory during storage of the second data, to switch to perform an alternative storage operation that is faster than the second type of storage command and protects at least the first data from the interruption.

There is also provided, in accordance with an embodiment of the present invention, apparatus including an interface and storage circuitry. The interface is configured to communicate with a memory that includes multiple analog memory cells. The storage circuitry is configured to store first data in a group of the memory cells using a first type of storage command that writes respective analog values to the memory cells in the group, to store in the memory cells in the group second data, in addition to the first data, using a second type of storage command that modifies the respective analog values of the memory cells in the group, and, upon detecting imminent interruption of electrical power to the memory during storage of the second data, to switch to perform an alternative storage operation that is faster than the second type of storage command and protects at least the first data from the interruption.

The present invention will be more fully understood from the following detailed description of the embodiments thereof, taken together with the drawings in which:

DETAILED DESCRIPTION OF EMBODIMENTS

Overview

Figure 1:
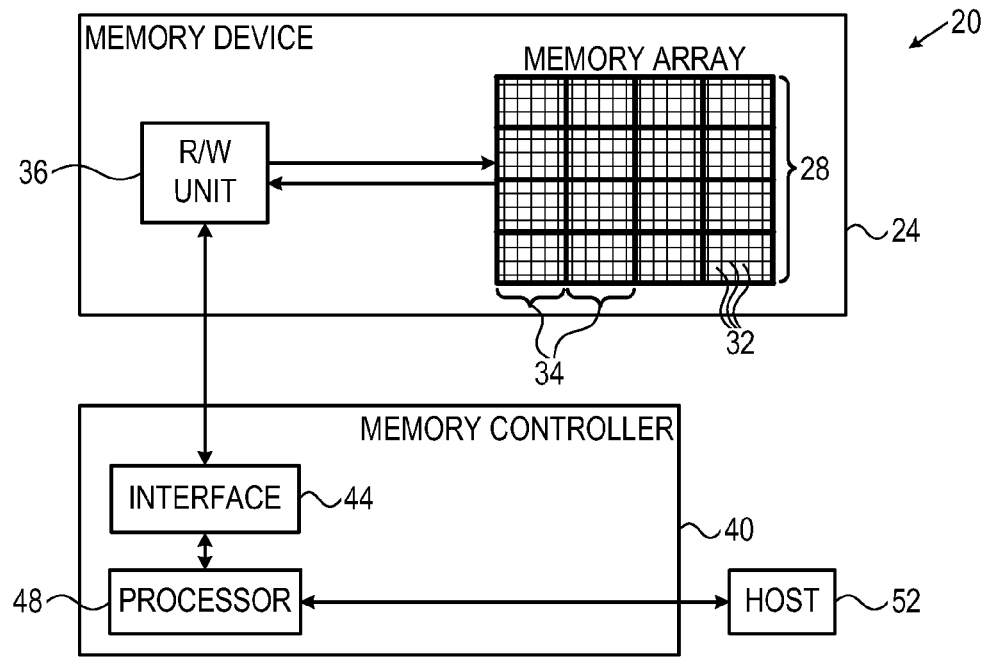
FIG. 1 is a block diagram that schematically illustrates a memory system, in accordance with an embodiment of the present invention.

Memory devices that comprise analog memory cells, e.g., Flash devices, store data by programming the memory cells to assume certain programming levels that represent the data. If the programming operation is disrupted, such as due to electrical power interruption, the stored data may be lost or corrupted.

Multi-Level Cell (MLC) devices, which store multiple data bits in each memory cell, are particularly sensitive to programming interruption. For example, different bits in a given multi-level cell sometimes belong to different data items and may be stored at different times. A given file may be stored in the Least Significant Bits (LSB) of a certain group of multi-level memory cells, and another file may be stored in the Most Significant Bits (MSB) of these memory cells at a later time. If the MSB storage operation is interrupted, the analog values of the cells are distorted and the distortion is likely to corrupt both the LSB and MSB. While corruption of the currently-written data (the MSB) may be permissible in some applications, corruption of the LSB (which often belongs to another data item and may have been written at a much earlier time) is highly undesirable.

Embodiments of the present invention that are described hereinbelow provide improved methods and systems for storing data in multi-level analog memory cells. The disclosed techniques protect the LSB data in a group of memory cells from power interruption occurring during MSB storage in the group. Although the embodiments described herein refer mainly to 2 bits/cell memory cells that each store an LSB and an MSB, the disclosed techniques can be used in any other suitable type of MLC. The terms "LSB" and "MSB" thus refer, respectively, to any lower-order and higher-order bits of an MLC, such as the low-order and middle-order bits or the middle-order and high-order bits of a 3 bits/cell MLC.

In some embodiments, a storage system comprises a memory that comprises multiple analog memory cells, and storage circuitry (e.g., a memory controller and/or circuitry coupled to the memory). Among other tasks, the storage circuitry detects approaching power supply interruptions and takes appropriate actions.

Upon detecting an imminent interruption during MSB storage in a group of memory cells, the storage circuitry switches to perform an alternative storage operation. The alternative storage operation protects at least the LSB data stored in the same group of memory cells from the interruption, i.e., enables recovery of the LSB data even if the MSB storage is disrupted. In addition, alternative storage operation is considerably faster than the MSB storage operation, and therefore has a better chance of completing successfully while power is still available.

Various examples of alternative storage operations are described herein. In some embodiments, the storage circuitry backs-up the LSB data before starting MSB storage. When detecting that power interruption is approaching, the storage circuitry stores at least the LSB data, and possibly the MSB data too, in an alternative location in the memory. This storage is typically performed using LSB storage commands, in order to reduce storage time. Moreover, this storage may be performed with faster programming parameters such as verification threshold and/or magnitude increment between programming pulses.

In other embodiments, the alternative storage operation programs the memory cells in the group to an alternative set of programming levels. The alternative set of programming levels is different from the normal set used for MSB storage, and is designed specifically to preserves the LSB data. The alternative set typically has fewer programming levels than the normal set, and is faster to program.

In other embodiments, upon detecting that power interruption is approaching, the storage circuitry suspends the MSB storage operation and backs-up the state of the operation at the time of suspension. The backed-up state comprises, for example, the content of one or more page buffers of the memory. After the power interruption ends, the storage circuitry recovers the backed-up state of the MSB storage operation, and resumes the MSB storage operation from the point it was suspended.

In some embodiments, the storage circuitry assesses the progress of the MSB storage operation, and decides whether or not to switch to the alternative storage operation. For example, if the MSB storage operation is nearly completed, the storage circuitry may decide to continue normal storage. If the MSB storage operation is still in its early stages, the storage may decide to switch to the alternative storage operation.

Some of the disclosed techniques enable MSB storage even after power is interrupted. Therefore, in some embodiments it is possible to send an acknowledgement to the host even if the memory device did not complete the programming operation.

In summary, the disclosed techniques improve the capability of memory devices to handle electrical power interruptions with minimal data loss or corruption. By using the disclosed techniques, data storage reliability and integrity can be increased. Moreover, since the alternative storage operation is faster than the MSB storage operation, the disclosed techniques reduce the time period needed for advance power-down notification.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In some embodiments, the memory cells of a given bit line are divided into groups that are referred to as strings. The memory cells in each string are connected source-to-drain in series with one another, between the bit line and ground. Each string can typically be connected and disconnected individually to the bit line.

The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes techniques for preventing data loss in the event of electrical power interruption in system 20. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Interruption-Proof MSB Programming Schemes

In some embodiments, each memory cell 32 is capable of storing at least a Least Significant Bit (LSB) and a Most Significant Bit (MSB). Memory controller 40 stores a page of data (referred to as an LSB page) in the LSBs of the memory cells in the group, and another page of data (referred to as an MSB page) in the MSBs of the memory cells in the group.

Depending on the specific design of memory device 24, data pages may be stored in various types of groups of memory cells. In some embodiments, all the memory cells associated with a given word line are defined as a group. As another example, the odd-order cells in a given word line may be defined as one group, and the even-order cells as a separate group.

In 2 bits/cell memory cells, such as in the embodiments described below, each group of memory cells holds two pages—an LSB page and an MSB page. In higher-order MLC, a group of memory cells holds a larger number of pages. The disclosed techniques can be used, mutatis mutandis, in any suitable type of MLC, such as in 3 bits/cell or 4 bits/cell devices. The description that follows focuses on 2 bits/cell MLC for the sake of clarity.

In some embodiments, memory controller 40 and memory device 24 support two types of storage commands—An LSB storage command that programs an LSB page in a group of memory cells, and an MSB storage command that programs an MSB page in the group. The MSB storage command modifies the analog values of the memory cells, from programming levels that represent the LSB data to programming levels that jointly represent the LSB and MSB data.

If the MSB storage operation is interrupted at some point, the analog values of the memory cells may remain in some unpredictable interim values that do not represent the LSB or the MSB data. Thus, interruption of the MSB storage command may corrupt both the previously-stored LSB data and the currently-stored MSB data. The MSB data may still be available in the memory controller and used for recovering from the interruption. The LSB data, on the other hand, is often unavailable. Moreover, in many cases the controller has already acknowledged to host 52 (or other upper layer) that the LSB data is safely committed to the non-volatile memory. Therefore, loss or corruption of the LSB data as a result of MSB storage interruption is typically considered a severe error.

In some embodiments, memory controller 40 and memory device 24 take measures to protect the previously-stored LSB data from power interruptions occurring during MSB storage. The techniques described below involve various kinds of alternative storage operations, which may be invoked in response to detecting imminent power interruption during MSB storage.

In the embodiments described herein, memory controller 40 detects that power interruption is imminent by receiving an advance notification from host 52. In alternative embodiments, the memory controller and/or memory device may detect an approaching power interruption in any other suitable way.

In some embodiments, memory controller 40 uses the disclosed techniques in every MSB storage operation. In other embodiments, the memory controller defines some word lines as sensitive to power interruption, and applies the disclosed techniques only in MSB storage operations to these word lines. A word line may be defined as sensitive to power interruption, for example, if the LSB page of that word line has already been acknowledged to host 52 as committed successfully.

Figure 2:
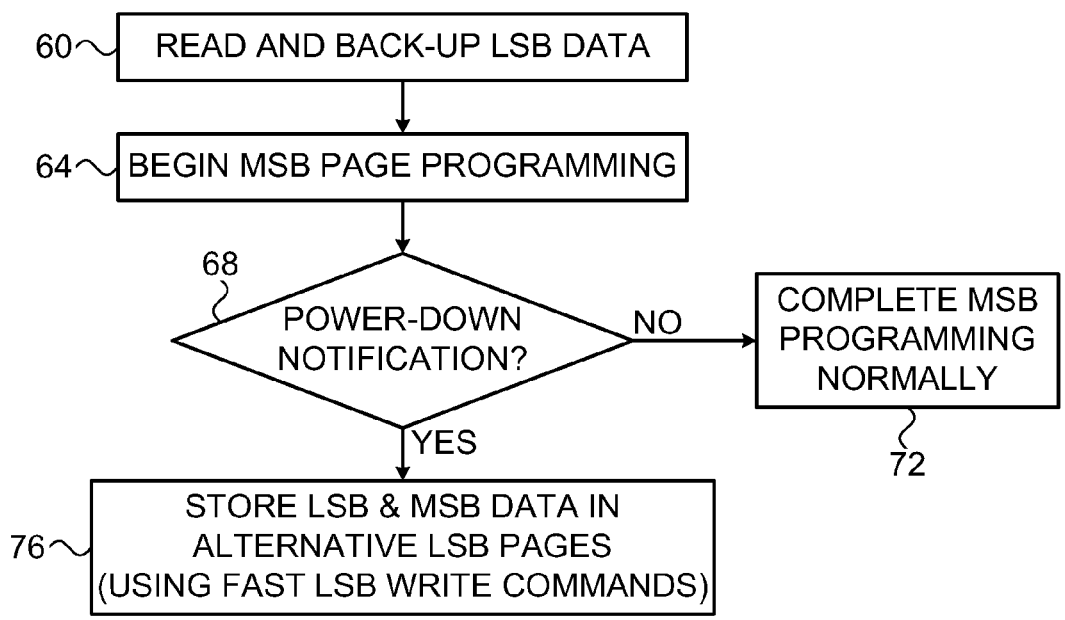
FIG. 2 is a flow chart that schematically illustrates a method for interruption-proof programming of memory cells, in accordance with an embodiment of the present invention.

FIG. 2 is a flow chart that schematically illustrates a method for interruption-proof programming of memory cells, in accordance with an example embodiment of the present invention. The method of FIG. 2 begins when memory controller 40 prepares to program an MSB page in a certain group of memory cells 32.

Before beginning MSB storage, the memory controller reads and backs-up the data stored in the LSB page of that group of memory cells, at an LSB back-up step 60. The memory controller may back-up the LSB page, for example, in an internal Random Access Memory (RAM) of the memory controller.

After backing-up the LSB data, memory controller 40 and R/W unit 36 begin storing the MSB page, at an MSB storage step 64. During MSB storage, the memory controller checks whether electrical power interruption is imminent, at an interruption checking step 68. The memory controller may check, for example, for advance notification from host 52. If no power interruption is expected, the memory controller continues and completes the MSB programming normally, and the method terminates, at a normal completion step 72.

If the memory controller detects that power interruption is approaching at step 68, it stores both the backed-up LSB data and the MSB data that is currently being stored in alternative locations, at an alternative storage step 76. Typically, the memory controller performs these alternative storage operations using two LSB storage commands, i.e., stores the LSB data and MSB data is two LSB pages of other groups of memory cells. Typically, two LSB storage commands are much faster than a single MSB storage command, and therefore the alternative storage operation (step 76) has a better chance of completing successfully before the power interruption than the normal MSB storage operation (steps 64, 72). In some embodiments, the memory controller may further speed-up the alternative storage operation of step 76 by performing it using faster programming parameters, such as lower verification threshold and/or larger magnitude increment between programming pulses.

The actual benefit of using the alternative storage operation depends on the progress of the MSB storage operation at the time of detecting the approaching power interruption. If the power interruption is detected when the MSB storage has only begun, it is likely that switching to the alternative storage operation (two LSB storage commands) is worthwhile. If, on the other hand, the power interruption is detected when the MSB storage is about to complete, there may be no gain in switching to the alternative storage operation.

Therefore, in some embodiments, after detecting an approaching power interruption, memory controller 40 and/or R/W unit 36 assesses the progress of the MSB storage operation, and decides whether or not to switch to the alternative storage operation depending on the progress. The R/W unit typically compares the time overhead of switching to the alternative storage operation (in the present example, aborting the normal MSB storage command and performing two LSB storage commands), and decides whether the overall gain is sufficient to justify a switch. When the decision is taken by the memory device, the memory device typically reports its decision to the memory controller. In other embodiments, the method of FIG. 2 is carried out whenever imminent power interruption is detected during MSB storage.

Another example process for interruption-proof MSB storage is described below. Unlike the method of FIG. 2 above, this process does not involve advance backing-up of the LSB page data. In this embodiment, upon detecting imminent power interruption, memory controller 40 sends a dedicated command (referred to as an "emergency command") to memory device 24.

Figure 3:
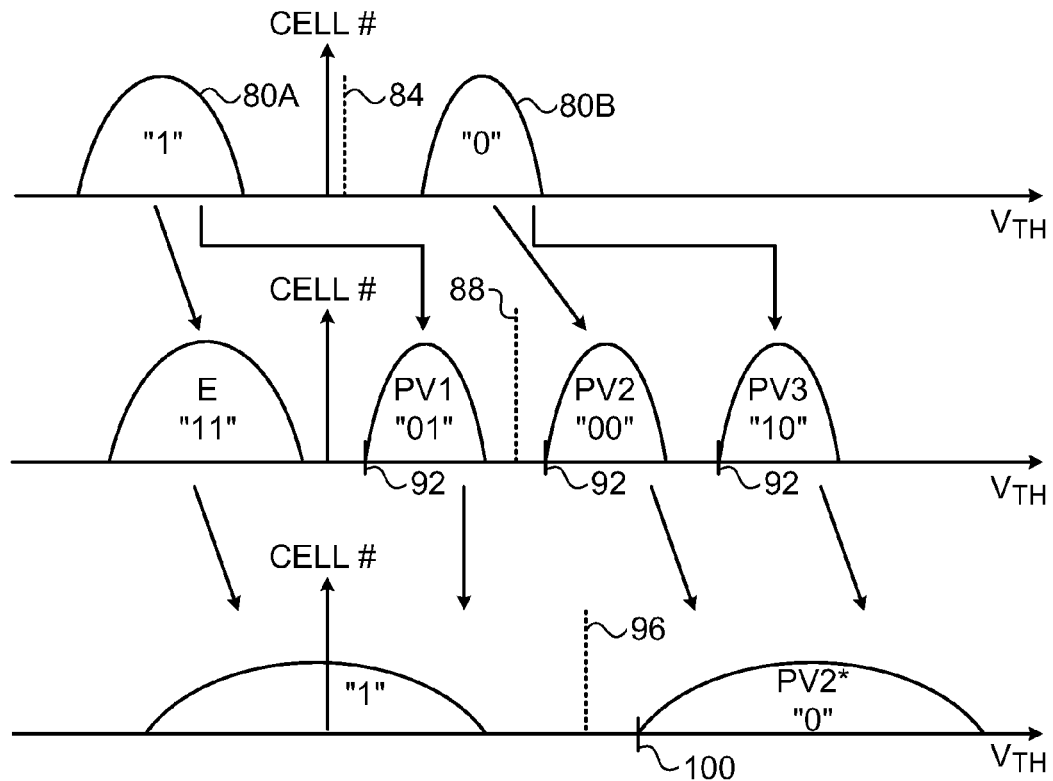
FIG. 3 is a graph showing programming level distributions during interruption-proof programming of memory cells, in accordance with an embodiment of the present invention.

In response to the emergency command, R/W unit 36 in the memory device switches to an alternative programming operation. The alternative programming operation, which may be invoked at any time during the MSB programming, modifies the analog values of the memory cells such that the LSB page remains decodable. FIG. 3 below demonstrates this process.

FIG. 3 is a graph showing programming level distributions during interruption-proof programming of memory cells, in accordance with an embodiment of the present invention. The top graph in FIG. 3 shows the distribution of the memory cell threshold voltages ($V_{TH}$) after the LSB page has been programmed. At this stage, the threshold voltages are distributed in two programming levels 80A and 80B, corresponding to LSB="1" and LSB="0", respectively. Programming level 80A is also the erased level. The LSB page can be read, for example, by comparing the cell threshold voltages to a read threshold 84.

The middle graph in FIG. 3 shows the $V_{TH}$ distribution in the group of memory cells after normal MSB programming. The normal MSB storage operation produces four programming levels denoted E (also the erased level), PV1, PV2 and PV3:

| Programming level | LSB value | MSB value |
| --- | --- | --- |
| E | "1" | "1" |
| PV1 | "1" | "0" |
| PV2 | "0" | "0" |
| PV3 | "0" | "1" |

The MSB storage operation essentially splits level 80A into levels E and PV1, and splits level 80B into levels PV2 and PV3. As can be seen in the figure, the LSB page can be read at this stage using a read threshold 88.

Typically, R/W unit 36 carries out the MSB storage command by applying a sequence of programming pulses that progressively increase in energy to the memory cells. The energy increment between successive pulses is sometimes referred to as Incremental Step Pulse Programming (ISPP). After each pulse, the R/W unit verifies the cell threshold voltages against a set of verification thresholds 92. Subsequent pulses are applied only to the cells that have not yet reached their intended programming level. This process is referred to as a Programming and Verification (P&V) process.

Consider a scenario in which electrical power is interrupted during execution of the MSB storage command, i.e., while the R/W unit is in the process of shifting the cell threshold voltages from the two programming levels at the top graph (80A, 80B) to the four programming levels at the middle graph (E, PV1, PV2, PV3). At this point in time, the cell threshold voltages may remain at some interim unpredictable values that are not associated with any programming level. In other words, at this point in time, it may be impossible to decode the LSB data from the values of the memory cell threshold voltages.

In some embodiments, memory controller 40 and R/W unit 36 prevents such a loss of LSB data using the "emergency command" described above. The outcome of the emergency command is shown in the bottom graph of FIG. 3. In the present embodiment, upon receiving the emergency command, R/W unit 36 switches to an alternative programming scheme that performs the following:

Stops applying programming pulses to the memory cells destined to reach level PV1.

Programs the memory cells, which were originally destined to reach levels PV2 and PV3, so as to reach an alternative programming level denoted PV2*.

The R/W unit may produce level PV2*, for example, using a verification threshold 100. Note that the verification threshold of level PV2* (bottom graph) is possibly higher than the verification threshold of level PV2 (middle graph). Therefore, any memory cell that was destined to reach levels PV2 and PV3 can be programmed to reach level PV2*.

After executing the emergency command, the cell threshold voltages are distributed in the two programming levels shown in the bottom graph of the figure. This configuration enables recovering the LSB page using a read threshold 96.

Figure 4:
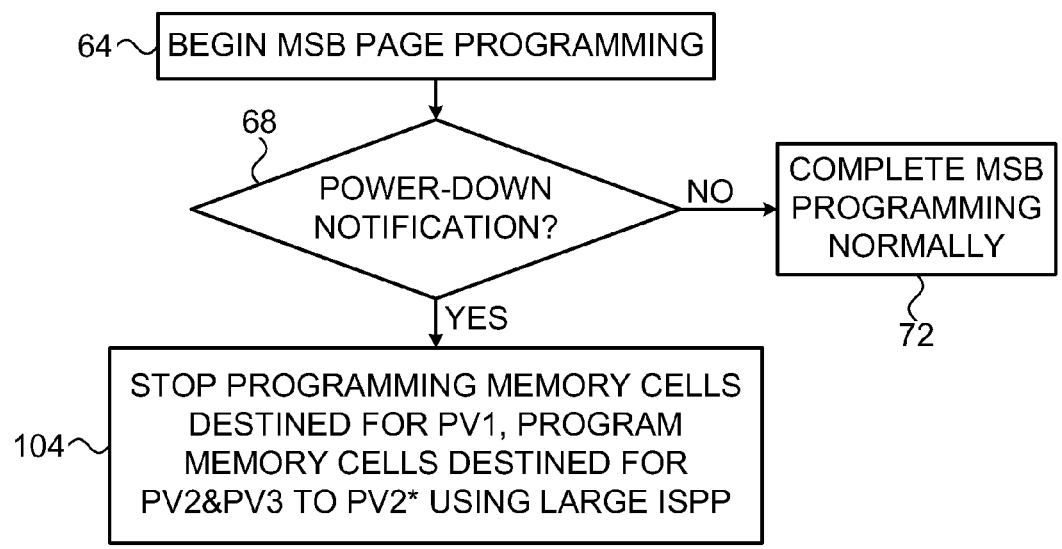
FIG. 4 is a flow chart that schematically illustrates the interruption-proof programming process of FIG. 3, in accordance with an embodiment of the present invention.

FIG. 4 is a flow chart that schematically illustrates the programming process of FIG. 3, in accordance with an embodiment of the present invention. The method begins with memory controller 40 and R/W unit 36 beginning MSB storage at step 64.

While executing the MSB storage command, memory controller 40 checks whether electrical power interruption is imminent, at step 68. If no power interruption is expected, the memory controller continues and completes the MSB programming normally at step 72.

If memory controller 40 detects that power interruption is approaching, it sends the dedicated emergency command to R/W unit 36. In response to the emergency command, the R/W unit switches to the alternative storage scheme, at an alternative programming step 104. In the present example, the R/W unit stops programming the memory cells destined to reach level PV1, and programs the memory cells destined to reach levels PV2 and PV3 so as to reach level PV2*.

In some embodiments, the R/W unit programs the memory cells to reach PV2* (step 104) using a large energy increment (ISPP) between programming pulses, larger than the increment used for normal MSB programming at steps 64 and 72. The large energy increment speeds-up the programming of step 104, and therefore increases the probability that the alternative programming will complete successfully before the power interruption. In alternative embodiments, the R/W unit programs the memory cells to reach PV2* by applying a single large-magnitude pulse and without verification. After power is resumed, the data is recovered, possibly with a high pass voltage (Vpass) in order to mitigate bit line blockage.

As explained above, in some embodiments the memory controller and/or the R/W unit assesses the progress of the MSB storage operation, and decides whether or not to switch to the alternative storage operation depending on the progress. When the decision is taken by the memory device, the memory device reports its decision to the memory controller. In other embodiments, the method of FIGS. 3 and 4 is carried out whenever imminent power interruption is detected during MSB storage.

Figure 5:
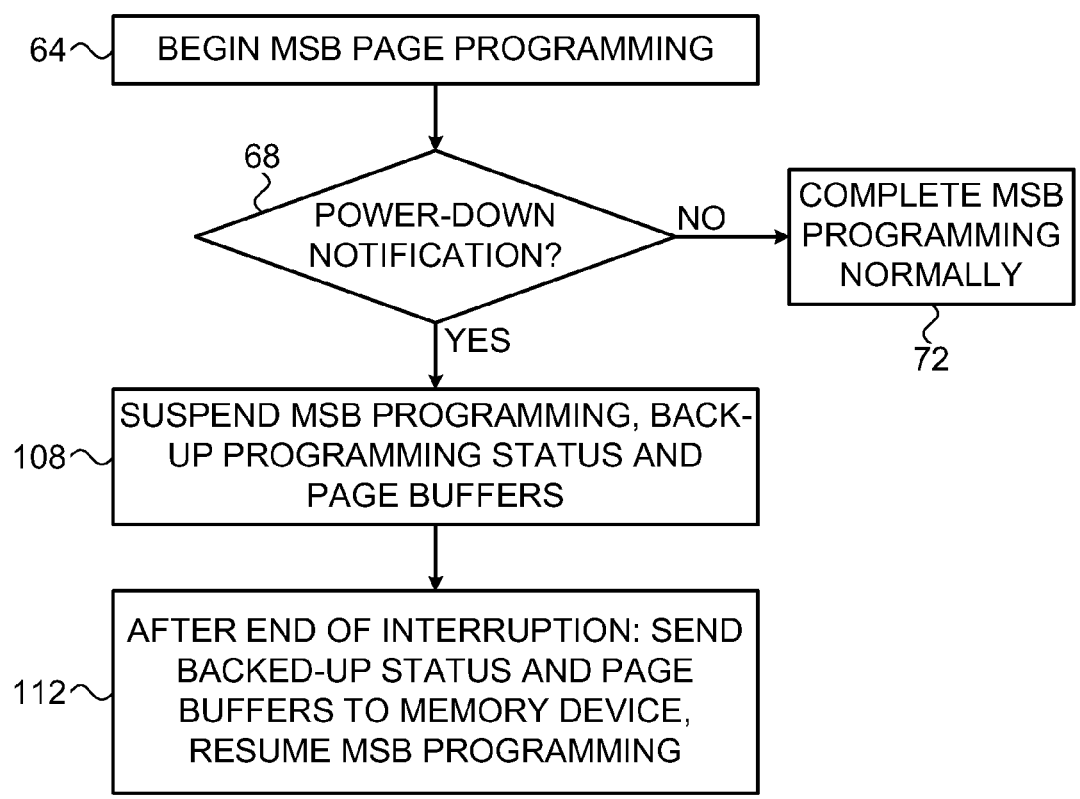
FIG. 5 is a flow chart that schematically illustrates a method for interruption-proof programming of memory cells, in accordance with an alternative embodiment of the present invention.

FIG. 5 is a flow chart that schematically illustrates a method for interruption-proof programming of memory cells, in accordance with yet another embodiment of the present invention. In this method, the memory controller suspends the MSB storage operation upon detecting imminent power interruption, and resumes the MSB storage operation from the point it was suspended after the interruption ends.

The method of FIG. 5 begins with memory controller 40 and R/W unit 36 beginning MSB storage at step 64. While executing the MSB storage command, memory controller 40 checks whether electrical power interruption is imminent, at step 68. If no power interruption is expected, the memory controller continues and completes the MSB programming normally at step 72.

If memory controller 40 detects that power interruption is approaching, it suspends the MSB storage operation, at a suspension step 108. The memory controller backs-up the complete state of the MSB storage operation at the time of suspension, so that it will be possible to resume the operation at a later time. The state information is typically stored in other groups of memory cells 32, e.g., using one or more LSB storage operations.

Some of the state information may be obtained from memory device 24. The state information may comprise, for example, the current content of one or more volatile page buffers of memory device 24, which are used by the memory device in the programming process. Additionally or alternatively, the state information may comprise any other suitable information.

At some point in time after the power interruption ends, memory controller 40 resumes the MSB storage operation, at a resumption step 112. The memory controller retrieves the backed-up state information, e.g., the page buffer content and sends the state information to R/W unit 36. The R/W unit resumes the MSB storage operation from the point it was suspended using the state information.

As explained above, in this embodiment too the memory device may decide whether or not to switch to the alternative storage scheme based on the current progress of the MSB command execution. The memory device may report its decision to the memory controller.

The alternative storage schemes described in FIGS. 2-5 are example schemes that are chosen purely for the sake of conceptual clarity. In alternative embodiments, memory controller 40 and/or R/W unit 36 may apply any other suitable storage scheme that protects the LSB data in the event of power interruption during MSB storage.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   in a memory comprising a plurality of memory cells, storing first data in a group of the plurality of memory cells using a first type of storage command, wherein the first type of storage command programs a first subset of the memory cells in the group to a first programming level and programs a second subset of the memory cells in the group to a second programming level;
   storing second data in the memory cells in the group, in addition to the first data, using a second type of storage command, wherein the second type of storage command programs a portion of the first subset to a third programming level and programs a portion of the second subset to a fourth programming level;
   reading the first data in the group using a first read threshold voltage;
   upon detecting imminent interruption of electrical power to the memory during storage of the second data, switching to perform an alternative storage operation, wherein the alternative storage operation ceases programming the first subset and programs the second subset to a fifth programming level, different than the fourth programming level; and
   reading the first data in the group using a second read threshold voltage, greater than the first read threshold voltage, after the interruption of electrical power occurs.

2. The method according to claim 1, wherein the first programming level, the second programming level, the third programming level, the fourth programming level, and the fifth programming level are different from each other.

3. The method according to claim 1, wherein the fifth programming level is greater than the first programming level and the second programming level.

4. The method according to claim 1, wherein programming the second subset to the fifth programming level comprises applying a single programming pulse to the second subset of the memory cells in the group.

5. The method according to claim 1, wherein programming the portion of the second subset to a fourth programming level comprises applying to the portion of the second subset of the memory cells in the group programming pulses that increase in energy by a given increment, and wherein programming the second subset to the fifth programming level comprises applying to the second subset of the memory cells in the group alternative programming pulses that increase in energy by an alternative increment, larger than the given increment.

6. The method according to claim 1, wherein switching to perform the alternative storage operation comprises suspending the storage of the second data, backing-up a state of the storage that was suspended, and, after the interruption ends, recovering the backed-up state and resuming the storage of the second data using the recovered state.

7. The method according to claim 6, wherein backing-up the state comprises backing-up a current content of one or more page buffers of the memory.

8. The method according to claim 6, wherein backing-up the state comprises storing the state in an alternative group of the memory cells using the first type of storage command.

9. An apparatus comprising:
a memory including multiple memory cells; and
storage circuitry configured to:
store first data in a group of the multiple memory cells using a first type of storage command, wherein the first type of storage command programs a first subset of the memory cells in the group to a first programming level and programs a second subset of the memory cells in the group to a second programming level;
store second data in the memory cells in the group, in addition to the first data, using a second type of storage command, wherein the second type of storage command programs a portion of the first subset to a third programming level and programs a portion of the second subset to a fourth programming level;
read the first data in the group using a first read threshold voltage;
upon detecting imminent interruption of electrical power to the memory during storage of the second data, to switch to perform an alternative storage operation, wherein the alternative storage operation ceases programming the first subset and programs the second subset to a fifth programming level, different than the fourth programming level; and
read the first data in the group using a second read threshold voltage, greater than the first read threshold voltage, after the interruption of electrical power occurs.

10. The apparatus according to claim 9, wherein the first programming level, the second programming level, the third programming level, the fourth programming level, and the fifth programming level are different from each other.

11. The apparatus according to claim 9, wherein the fifth programming level is greater than the first programming level and the second programming level.

12. The apparatus according to claim 9, wherein to program the second subset to the fifth programming level, the storage circuitry is further configured to apply a single programming pulse to the second subset of the memory cells in the group.

13. The apparatus according to claim 9, wherein the storage circuitry is further configured to:
program the portion of the second subset to a fourth programming level by applying to the portion of the second subset of the memory cells in the group programming pulses that increase in energy by a given increment; and
program the second subset to the fifth programming level by applying to the second subset of the memory cells in the group alternative programming pulses that increase in energy by an alternative increment, larger than the given increment.

14. The apparatus according to claim 9, wherein the storage circuitry is further configured to perform the alternative storage operation by suspending the storage of the second data, backing-up a state of the storage that was suspended, and, after the interruption ends, recovering the backed-up state and resuming the storage of the second data using the recovered state.

15. The apparatus according to claim 9, wherein, upon detecting the imminent interruption, the storage circuitry is further configured to assess a progress of the storage of the second data and to decide whether to switch to perform the alternative storage operation depending on the assessed progress.

16. An apparatus comprising:
an interface, which is configured to communicate with a memory including multiple memory cells; and
storage circuitry configured to:
store first data in a group of the multiple memory cells using a first type of storage command, wherein the first type of storage command programs a first subset of the memory cells in the group to a first programming level and programs a second subset of the memory cells in the group to a second programming level;
store second data in the memory cells in the group, in addition to the first data, using a second type of storage command, wherein the second type of storage command programs a portion of the first subset to a third programming level and programs a portion of the second subset to a fourth programming level;
read the first data in the group using a first read threshold voltage;
upon detecting imminent interruption of electrical power to the memory during storage of the second data, to switch to perform an alternative storage operation, wherein the alternative storage operation ceases programming the first subset and programs the second subset to a fifth programming level, different than the fourth programming level; and
read the first data in the group using a second read threshold voltage, greater than the first read threshold voltage, after the interruption of electrical power occurs.

17. The apparatus according to claim 16, wherein the first programming level, the second programming level, the third programming level, the fourth programming level, and the fifth programming level are different from each other.

18. The apparatus according to claim 16, wherein the fifth programming level is greater than the first programming level and the second programming level.

19. The apparatus according to claim 18, wherein to program the second subset to the fifth programming level, the storage circuitry is further configured to apply a single programming pulse to the second subset of the memory cells in the group.

20. The apparatus according to claim 17, wherein the storage circuitry is further configured to:
program the portion of the second subset to a fourth programming level by applying to the portion of the second subset of the memory cells in the group programming pulses that increase in energy by a given increment; and
program the second subset to the fifth programming level by applying to the second subset of the memory cells in the group alternative programming pulses that increase in energy by an alternative increment, larger than the given increment.

* * * * *